(12) United States Patent
Kashiwabara

(10) Patent No.: US 8,927,980 B2
(45) Date of Patent: Jan. 6, 2015

(54) ORGANIC ELECTROLUMINESCENCE DISPLAY DEVICE

(71) Applicant: Samsung Display Co., Ltd., Yongin, Gyeonggi-Do (KR)

(72) Inventor: Mitsuhiro Kashiwabara, Yokohama (JP)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/031,104

(22) Filed: Sep. 19, 2013

(65) Prior Publication Data
US 2014/0077198 A1    Mar. 20, 2014

(30) Foreign Application Priority Data
Sep. 20, 2012 (JP) .................. 2012-207169

(51) Int. Cl.
*H01L 51/52* (2006.01)
*H01L 51/54* (2006.01)
*H01L 51/50* (2006.01)

(52) U.S. Cl.
CPC ........ *H01L 51/5096* (2013.01); *H01L 51/5064* (2013.01)
USPC ............................................. 257/40

(58) Field of Classification Search
USPC ......................... 257/40; 438/22–47
See application file for complete search history.

(56) References Cited

U.S. PATENT DOCUMENTS 8,436,345 B2 * 5/2013 Oyamada et al. ............... 257/40

FOREIGN PATENT DOCUMENTS

JP    2004-514257 A    5/2004
JP    2007-173779 A    7/2007

* cited by examiner

*Primary Examiner* — Daniel Shook
(74) *Attorney, Agent, or Firm* — Lee & Morse, P.C.

(57) ABSTRACT

An organic electroluminescence display device includes a p-doped layer doped with a P-type dopant on an anode electrode, a P-type dopant diffusion blocking layer on the p-doped layer, a first hole transport layer on the P-type dopant diffusion blocking layer, a light emitting layer on the first hole transport layer, an electron transport layer on light emitting layer, and a cathode electrode on the electron transport layer, the p-doped layer, the P-type dopant diffusion blocking layer, the hole transport layer, and the light emitting layer being stacked in the stated order on the anode.

10 Claims, 1 Drawing Sheet

ORGANIC ELECTROLUMINESCENCE DISPLAY DEVICE

CROSS-REFERENCE TO RELATED APPLICATION

Japanese Patent Application No. 2012-207169, filed on Sep. 20, 2012, in the Japanese Intellectual Property Office, and entitled: "Organic Electroluminescence Display Device," is incorporated by reference herein in its entirety.

BACKGROUND

1. Field

Embodiments described herein relate to an organic electroluminescence display device using organic electroluminescence elements.

2. Description of the Related Art

An electroluminescence element is a self-emitting type display element, and has a wide viewing angle, excellent contrast, and excellent response time. The electroluminescence element is classified into an organic electroluminescence element and an inorganic electroluminescence element based on a material forming a light emitting layer therein. As compared to the inorganic electroluminescence element, the organic electroluminescence element has excellent brightness, driving voltage, and response speed characteristics. Also, the organic electroluminescence element is capable of expressing many colors.

In the organic electroluminescence element, typically, an anode electrode is formed on a substrate, and a hole transport layer HTL, a light emitting layer EML, an electron transport layer ETL, and a cathode electrode are sequentially stacked on the anode electrode. For example, the hole transport layer HTL, the light emitting layer EML, and the electron transport layer ETL may be organic thin films formed of an organic compound.

When voltage is applied between the anode electrode and the cathode electrode of the organic electroluminescence element, holes injected from the anode electrode migrate into the light emitting layer EML through the hole transport layer HTL. Similarly, electrons migrate into the light emitting layer EML through the electron transport layer ETL from the cathode electrode. Afterwards, excitons are generated by recombination of holes and electrons in the light emitting layer EML. The excitons transition from an excited state to a ground state, so that fluorescent molecules of the light emitting layer EML emit light. As light emission can selectively occur in every pixel, an image is formed on a panel where organic electroluminescence elements are integrated.

In the organic electroluminescence element, a micro cavity structure is utilized to improve both color stability of a light emission color and contrast. The micro cavity structure is a structure for generating a micro cavity effect. With the micro cavity effect, light generated in the light emitting layer EML is iteratively reflected between the anode electrode and the cathode electrode, so that light of a corresponding peak wavelength resonates and is emphasized, and light getting out of the corresponding peak wavelength is attenuated. In between the anode electrode and the cathode electrode, a length of a light path of an organic medium is adjusted so as to correspond to a spectrum peak wavelength of each original color light of RGB. For example, a red color light is obtained using a thicker organic layer, and a blue color light is obtained using a thinner organic layer.

SUMMARY

Embodiments are directed toward an organic electroluminescence display device having a stable driving voltage over time with an increased driving lifetime of the light emitting layer and an excellent long-time reliability.

Embodiments provide an organic electroluminescence display device, including a p-doped layer doped with a P-type dopant on an anode electrode, a P-type dopant diffusion blocking layer on the p-doped layer, a first hole transport layer on the -type dopant diffusion blocking layer, a light emitting layer on the hole transport layer, an electron transport layer on light emitting layer, and a cathode electrode on the electron transport layer, the p-doped layer, the P-type dopant diffusion blocking layer, the hole transport layer, and the light emitting layer being stacked in the stated order on the anode.

The P-type dopant diffusion blocking layer may be a hexanitrile hexaazatriphenylene (HAT) layer.

The P-type dopant diffusion blocking layer may have a thickness of about 1 nm to about 20 nm.

The P-type dopant diffusion blocking layer may have a thickness of about 1 nm to about 20 nm.

The organic electroluminescence display device may further include a hole injection layer between the anode electrode and the p-doped layer.

The P-type dopant diffusion blocking layer may be separate from and include a different material than the p-doped layer.

The p-doped layer may be a second hole transport layer including NPB (N,N-di(naphthalene-1-yl)-N,N-diphenylbenzidene).

The P-type dopant in the p-doped layer may be tetrafluorotetracyanoquinodimethane ($F_4$-TCNQ).

The first and second hole transport layers may be completely separated from each other by the P-type dopant diffusion blocking layer.

The P-type dopant diffusion blocking layer may be separate from and include a different material than the second hole transport layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
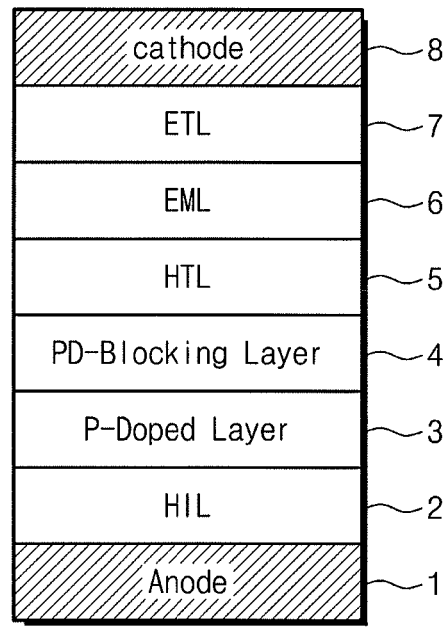
FIG. 1 illustrates a schematic cross-sectional view of an organic electroluminescence element of an organic electroluminescence display device according to an embodiment.

Embodiments will be described in detail with reference to the accompanying drawings. Embodiments, however, may be embodied in various different forms, and should not be construed as being limited only to the illustrated embodiments. Rather, these embodiments are provided as examples so that this disclosure will be thorough and complete, and will fully convey exemplary implementations to those skilled in the art. Accordingly, known processes, elements, and techniques are not described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a cross-sectional view of an organic electroluminescence element of an organic electroluminescence display device according to an embodiment. As illustrated in FIG. 1, an organic electroluminescence element according to an embodiment may include an anode electrode 1, a hole injection layer (HIL) 2, a P-doped layer 3, a p-type dopant diffusion blocking layer (hereinafter, 'PD-blocking layer') 4, a hole transport layer (HTL) 5, a light emitting layer (EML) 6, an electron transport layer (ETL) 7, and a cathode electrode 8 sequentially formed on a transparent substrate (not shown) as main components. In other words, as illustrated in FIG. 1, elements 1 through 8 may be positioned directly on top of each other in the order stated.

The anode electrode 1 may be a transparent electrode layer, and is supplied with holes when a driving voltage generated by a driving circuit (not shown) is applied to the anode electrode 1. For example, the anode electrode 1 may be formed of metal with large work function, e.g., larger than 4.5 eV. Examples of a material for the anode electrode 1 may include indium tin oxide (ITO), indium zinc oxide (IZO), tin oxide ($SnO_2$), or zinc oxide (ZnO).

The hole injection layer 2 may receive holes from the anode electrode 1. The hole injection layer 2 may be formed of, e.g., copper phthalocyanine (CuPc), TCTA, or m-MTDATA.

The P-doped layer 3 is a hole transport layer doped with a p-type dopant. The P-doped layer 3 transports holes from the hole injection layer 2 toward the light emitting layer 6. The P-doped layer 3 is effective in reducing a driving voltage of a whole organic electroluminescence element, and such an effect increases in proportion to an increase in a thickness of the P-doped layer 3. The P-type dopant may be, e.g., hexanitrile hexaazatriphenylene (HAT), $F_4$-TCNQ, $FeCl_3$, $F_{16}CuPc$, metal oxide ($V_2O_5$, $Re_2O_7$, ITO, etc.), etc.

The PD-blocking layer 4 transports holes from the P-doped layer 3 toward the light emitting layer 6. The PD-blocking layer 4 is effective in preventing a harmful influence from being generated in the light emitting layer 6 by blocking diffusion of the P-type dopant out of the P-doped layer 3, i.e., so the P-type dopant is sealed within the P-doped layer 3. In other words, the PD-blocking layer 4 blocks diffusion of p-type dopants from the P-doped layer 3 toward the hole transport layer 5, so thickness of the P-doped layer 3 may be increased. Accordingly, the effect of reducing voltage may be maximized due to the increased thickness of the P-doped layer 3.

The PD-blocking layer 4 is between, e.g., directly between, the P-doped layer 3 and the hole transport layer 5 in order to block diffusion of the p-type dopants from the P-doped layer 3 toward the hole transport layer 5. As such, a harmful influence of p-type dopants on the light emitting layer 6 may be prevented or substantially minimized.

A thickness of the PD-blocking layer 4 may be about 1 nm to about 20 nm in order to ensure blocking diffusion of the P-type dopant. If the thickness of the PD-blocking layer 4 is less than about 1 nm, it may be too thin to effectively block diffusion of the p-type dopants. If the thickness of the PD-blocking layer 4 is more than about 20 nm, the quality may be lowered by leak generation.

Also, the thickness of the PD-blocking layer 4 may be adjusted to a thickness that enables a distance between the anode electrode 1 and the cathode electrode 8 to generate a micro cavity effect through resonance of a wavelength of an original color to be emitted, in consideration of thicknesses of layers 2, 3, 5, 6, and 7. For example, the PD-blocking layer 4 may be formed of hexanitrile hexaazatriphenylene (HAT).

The hole transport layer 5 transports holes from the PD-blocking layer 4 toward the light emitting layer 6, and also prevents leakage of electrons from the light emitting layer 6. The hole transport layer 5 may be formed of, e.g., NPB (N,N-di(naphthalene-1-yl)-N,N-diphenyl-benzidene).

The cathode electrode 8 may be a reflection electrode layer, and is supplied with electrons when connected to a ground electrode of a driving circuit (not shown). The cathode electrode 8 may be formed of, e.g., lithium (Li), Magnesium (Mg), Aluminum (AL), Aluminum-Lithium alloy (Al—Li), Calcium (Ca), Magnesium-Indium alloy (Mg—In), and/or Magnesium-Silver alloy (Mg—Ag).

The electron transport layer 7 transports electrons from the cathode electrode 8 toward the light emitting layer 6, and prevents leakage of holes from the light emitting layer 6. The electrons transport layer 7 may be formed of, e.g., Alq3.

Also, an electron injection layer may be formed between the cathode electrode 8 and the electron transport layer 7. The electron injection layer may be formed of, e.g., Lithium Fluoride (LiF), Sodium Chloride (NaCl), Cesium Fluoride (CsF), Lithium Oxide ($Li_2O$), Barium Oxide (BaO), Liq, etc.

Excitons are generated in the light emitting layer 6 by recombination of holes transported by the hole transport layer 5 and electrons transported by the electron transport layer 7. Light is emitted when the excitons transition from an excited state to a ground state.

The light emitted from the light emitting layer 6 is emitted in all directions. However, light incident onto the cathode electrode 8 through the electron transport layer 7 is reflected from the cathode electrode 8 back toward the light emitting layer 6. Light directly incident onto the hole transport layer 5 after being generated in the light emitting layer 6 and light reflected from the cathode electrode 8 are incident onto the anode electrode 1 through the hole transport layer 5, the PD-blocking layer 4, the P-doped layer 3, and the hole injection layer 2. Lights is emitted to the exterior through the anode electrode 1 and a transparent substrate (not shown), by reflection via the above-described micro cavity effect.

Example 1

An organic electroluminescence element according to an embodiment may be formed as follows. The anode electrode 1 is formed using Indium Tin Oxide (ITO), the hole injection layer 2 is formed of a starburst amine (m-MTDATA) layer having a thickness of about 50 nm, the P-doped layer 3 is formed of an NPB (N,N-di(naphthalene-1-yl)-N,N-diphenyl-benzidene) layer, in which 1% of Tetrafluoro-tetracyano-quino-dimethane ($F_4$-TCNQ) is doped as a P-type dopant and that has a thickness of about 50 nm, the PD-blocking layer 4 is formed of an HAT (Hexanitrile hexaazatriphenylene) layer having a thickness of about 5 nm, the hole transport layer 5 is formed of a NPB layer having a thickness of about 20 nm, the light emitting layer 6 is formed of a film having a thickness of about 30 nm, the electron transport layer 7 is formed of a Tris(8-quinolinolato)aluminum (Alq3) film having a thickness of about 30 nm, and the cathode electrode 8 is formed of an aluminum film having a thickness of about 200 nm. Further, an electron injection layer, formed of Lithium Fluoride (LiF) to a thickness of about 1 nm, is disposed between the cathode electrode 8 and the electron transport layer 7.

A constant current source is connected between the anode electrode 1 and the cathode electrode 8, and a current of 10 mA per unit area (1 $cm^2$) is supplied to the current source. At this time, an emitted light is measured by a spectrum brightness meter, and external quantum efficiency (%) is obtained based on the measured quantity of light. Also, a driving voltage V is obtained by measuring a potential difference between both electrodes 1 and 8 under the above-described condition. Also, time is measured until the quantity of emitted light is lowered by 5% from its initial value, and the measured time is referred to as 'lifetime'. Further, a potential difference between both electrodes 1 and 8 is measured at a point of time when the quantity of emitted light is lowered by 5% from its initial value, the voltage increment V being obtained as a difference relative to the initial value.

In Example 1, the external quantum efficiency is 18.5%, the driving voltage is 6.6 V, the lifetime is 330 hours, and the voltage increment is 0.12 V.

Example 2

An organic electroluminescence element according to an embodiment may also be formed as follows, where a thickness of each layer was changed while maintaining a constant distance between the anode 1 and the cathode 8. In detail, the anode electrode 1 is formed using Indium Tin Oxide (ITO), the hole injection layer 2 is formed of a starburst amine (m-MTDATA) layer having a thickness of about 35 nm, the P-doped layer 3 is formed of an NPB (N,N-di(naphthalene-1-yl)-N,N-diphenyl-benzidene) layer in which 1% of Tetrafluoro-tetracyano-quino-dimethane ($F_4$-TCNQ) is doped as a P-type dopant and that has a thickness of about 50 nm, the PD-blocking layer 4 is formed of an HAT (Hexanitrile hexaazatriphenylene) layer having a thickness of about 20 nm, the hole transport layer 5 is formed of the NPB layer having a thickness of about 20 nm, the light emitting layer 6 is formed of a film having a thickness of about 30 nm, the electron transport layer 7 is formed of a Tris(8-quinolinolato) aluminum (Alq3) film having a thickness of about 30 nm, and the cathode electrode 8 is formed of an aluminum film having a thickness of about 200 nm. Similarly to EXAMPLE 1, an electron injection layer, formed of Lithium Fluoride (LiF) having a thickness of about 1 nm, is disposed between the cathode electrode 8 and the electron transport layer 7.

The measurements are carried out in the same manner as in Example 1, where external quantum efficiency is 18.5%, the driving voltage is 6.5V, the lifetime is 335 hours, and the voltage increment is 0.12V.

Figure 2:
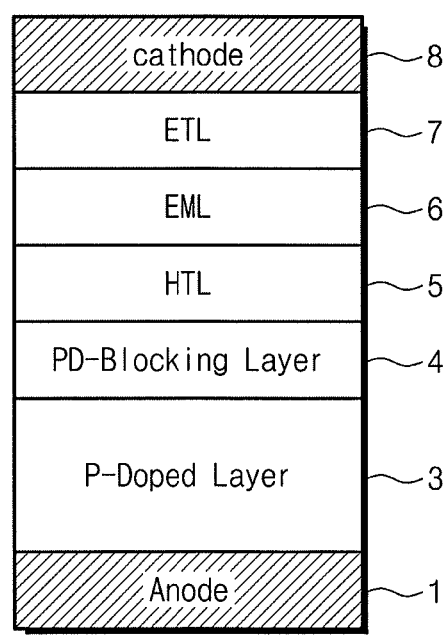
FIG. 2 illustrates a schematic cross-sectional view of an organic electroluminescence element of an organic electroluminescence display device according to another embodiment.

FIG. 2 illustrates a cross-sectional view of an organic electroluminescence element of an organic electroluminescence display device according to another embodiment. As illustrated in FIG. 2, an organic electroluminescence element according to another embodiment is different from the embodiment of FIG. 1 in that the hole injection layer 2 is eliminated and a thickness of a P-doped layer 3 is increased by the thickness of the hole injection layer 2. In the embodiment illustrated in FIG. 2, as the PD-blocking layer 4 having a thickness of about 1 nm to about 20 nm is interposed between the P-doped layer 3 and the hole transport layer 5, the P-type dopant is sealed within the P-doped layer 3. Therefore, a potential harmful influence of P-type dopants on the light emitting layer 6, e.g., caused by diffusion of the P-type dopants, may be prevented or substantially minimized. As compared to the embodiment of FIG. 1, the effect of reducing voltage is further improved by increasing the thickness of the P-doped layer 3, while securing a same distance between the anode electrode 1 and the cathode electrode 8 for the micro cavity effect.

Example 3

An organic electroluminescence element according to the other embodiment may be formed as follows. The anode electrode 1 is formed using Indium Tin Oxide (ITO), the P-doped layer 3 is formed of an NPB (N,N-di(naphthalene-1-yl)-N,N-diphenyl-benzidene) layer in which 1% of Tetrafluoro-tetracyano-quino-dimethane ($F_4$-TCNQ) is doped as a P-type dopant and that has a thickness of about 100 nm, the PD-blocking layer 4 is formed of an HAT (Hexanitrile hexaazatriphenylene) layer having a thickness of about 5 nm, the hole transport layer 5 is formed of the NPB layer having a thickness of about 20 nm, the light emitting layer 6 is formed of a film having a thickness of about 30 nm, the electron transport layer 7 is formed of a Tris(8-quinolinolato)aluminum (Alq3) film having a thickness of about 30 nm, and the cathode electrode 8 is formed of an aluminum film having a thickness of about 200 nm. The electron injection layer, formed of Lithium Fluoride (LiF) having a thickness of about 1 nm, is disposed between the cathode electrode 8 and the electron transport layer 7.

After carrying out the measurements in the same manner described previously with reference to EXAMPLES 1-2, the external quantum efficiency is 18.6%, the driving voltage is 6.2V, the lifetime is 335 hours, and the voltage increment is 0.13V.

The following Comparative Examples are provided in order to highlight characteristics of one or more embodiments, but they are not to be construed as limiting the scope of the embodiments, nor are the Comparative Examples to be construed as being outside the scope of the embodiments. Further, it will be understood that the embodiments are not limited to the particular details described in the Examples and Comparative Examples.

In the comparative examples below, a plurality of organic electroluminescence elements are formed by partly changing components of Examples 1-3, to verify the effects of the first and second embodiments. The performed measurement on each of the organic electroluminescence element was performed in the same manner as that described with reference to Examples 1-3. Below, components and measurement results of each comparison example are described.

Comparative Example 1

An organic electroluminescence element of an organic electroluminescence display device is formed as that in Example 1, with the exception of eliminating the P-doped layer 3 and the PD-blocking layer 4, while increasing the thickness of the hole transport layer 5 to maintain a same distance between electrodes 1 and 8. In particular, the anode electrode 1 is formed using Indium Tin Oxide (ITO), the hole injection layer 2 is formed of a starburst amine (m-MTDATA) layer having a thickness of about 50 nm, the hole transport layer 5 is formed of the NPB layer having a thickness of about 70 nm, the light emitting layer 6 is formed of a film having a thickness of about 30 nm, the electron transport layer 7 is formed of a Tris(8-quinolinolato)aluminum (Alq3) film having a thickness of about 30 nm, and the cathode electrode 8 is formed of an aluminum film having a thickness of about 200 nm. The electron injection layer, formed of Lithium Fluoride (LiF) having a thickness of about 1 nm, is disposed between the cathode electrode 8 and the electron transport layer 7. The carried out measurements provide that the external quantum efficiency is 18.5%, the driving voltage is 7.5V, the lifetime is 220 hours, and the voltage increment is 0.50V.

Comparative Example 2

An organic electroluminescence element of an organic electroluminescence display device is formed as that in Example 1, with the exception of eliminating the PD-blocking layer 4, while increasing the thickness of the P-doped layer 3 to maintain a same distance between electrodes 1 and 8. In particular, the anode electrode 1 is formed using Indium Tin Oxide (ITO), the hole injection layer 2 is formed of a starburst amine (m-MTDATA) layer having a thickness of about 50 nm, the P-doped layer 3 is formed of an NPB (N,N-di(naphthalene-1-yl)-N,N-diphenyl-benzidene) layer in which 1% of Tetrafluoro-tetracyano-quino-dimethane ($F_4$-TCNQ) is doped as a P-type dopant and that has a thickness of about 55 nm, the hole transport layer 5 is formed of the NPB layer having a thickness of about 20 nm, the light emitting layer 6 is formed of a film having a thickness of about 30 nm, the electron transport layer 7 is formed of a Tris(8-quinolinolato)aluminum (Alq3) film having a thickness of about 30 nm, and the cathode electrode 8 is formed of an aluminum film having a thickness of about 200 nm. The electron injection layer, formed of Lithium Fluoride (LiF) having a thickness of about 1 nm, is disposed between the cathode electrode 8 and the electron transport layer 7. The carried out measurements provide that the external quantum efficiency is 18.3%, the driving voltage is 6.9V, the lifetime is 190 hours, and the voltage increment is 0.30V.

Comparative Example 3

An organic electroluminescence element of an organic electroluminescence display device is formed as that in Example 1, with the exception of forming the PD-blocking layer 4 of a CBP (4,4'-Bis(carbazol-9-yl)biphenyl). In particular, the anode electrode is formed using Indium Tin Oxide (ITO), the hole injection layer formed of a starburst amine (m-MTDATA) layer having a thickness of about 50 nm is formed on the anode electrode, the P-doped layer formed of an NPB (N,N-di(naphthalene-1-yl)-N, N-diphenyl-benzidene) layer, in which 1% of Tetrafluoro-tetracyano-quino-dimethane ($F_4$-TCNQ) is doped as a P-type dopant, and that has a thickness of about 50 nm is formed on the hole injection layer, the CBP layer having a thickness of about 5 nm is formed on the P-doped layer, the hole transport layer formed of the NPB layer having a thickness of about 20 nm is formed on the CBP layer, the light emitting layer formed of a film having a thickness of about 30 nm is formed on the hole transport layer, the electron transport layer formed of a Tris (8-quinolinolato)aluminum (Alq3) film having a thickness of about 30 nm is formed on the light emitting layer, the electron injection layer formed of Lithium Fluoride (LiF) having a thickness of about 1 nm is formed on the electron transport layer, and a cathode electrode formed of aluminum having a thickness of about 200 nm is formed on the electron injection layer. The carried out measurements provide that the external quantum efficiency is 18.1%, the driving voltage is 7.9 V, the lifetime is 160 hours, and the voltage increment is 0.45 V.

Comparative Example 4

An organic electroluminescence element of an organic electroluminescence display device is formed as that in Example 1, with the exception of forming the PD-blocking layer 4 of a starburst amine (m-MTDATA) layer. In particular, the anode electrode is formed using Indium Tin Oxide (ITO), the hole injection layer formed of a starburst amine (m-MTDATA) layer having a thickness of about 50 nm is formed on the anode electrode, the P-doped layer formed of an NPB (N,N-di(naphthalene-1-yl)-N, N-diphenyl-benzidene) layer, in which 1% of Tetrafluoro-tetracyano-quino-dimethane ($F_4$-TCNQ) is doped as a P-type dopant and that has a thickness of about 50 nm is formed on the hole injection layer, a starburst amine (m-MTDATA) layer having a thickness of about 5 nm is formed on the P-doped layer, the hole transport layer formed of the NPB layer having a thickness of about 20 nm is formed on the starburst amine (m-MTDATA) layer, the light emitting layer formed of a film having a thickness of about 30 nm is formed on the hole transport layer, the electron transport layer formed of a Tris(8-quinolinolato)aluminum (Alq3) film having a thickness of about 30 nm is formed on the light emitting layer, the electron injection layer formed of Lithium Fluoride (LiF) having a thickness of about 1 nm is formed on the electron transport layer, and the cathode electrode formed of aluminum having a thickness of about 200 nm is formed on the electron injection layer. The carried out measurements provide that the external quantum efficiency is 17.6%, the driving voltage is 7.7 V, the lifetime is 145 hours, and the voltage increment is 0.55 V.

Comparative Example 5

An organic electroluminescence element of an organic electroluminescence display device is formed as that in Example 1, with the exception of forming, while maintaining a same distances between electrodes 1 and 8, the hole injection layer 2 with a thickness of about 5 nm and the PD-blocking layer 4 with a thickness of about 50 nm.

In particular, the anode electrode is formed using Indium Tin Oxide (ITO), the hole injection layer formed of a starburst amine (m-MTDATA) having a thickness of about 5 nm is formed on the anode electrode, the P-doped layer formed of an NPB (N, N-di(naphthalene-1-yl)-N,N-diphenyl-benzidene) layer, in which 1% of Tetrafluoro-tetracyano-quinodimethane ($F_4$-TCNQ) is doped as a P-type dopant, and that has a thickness of about 50 nm is formed on the hole injection layer, the PD-blocking layer formed of an HAT (Hexanitrile hexaazatriphenylene) layer having a thickness of about 50 nm is formed on the P-doped layer, the hole transport layer formed of the NPB layer having a thickness of about 20 nm is formed on the PD-blocking layer, the light emitting layer formed of a film having a thickness of about 30 nm is formed on the hole transport layer, the electron transport layer formed of a Tris(8-quinolinolato)aluminum (Alq3) film having a thickness of about 30 nm is formed on the light emitting layer, the electron injection layer formed of Lithium Fluoride (LiF) having a thickness of about 1 nm is formed on the electron transport layer, and the cathode electrode formed of aluminum having a thickness of about 200 nm is formed on the electron injection layer. The carried out measurements provide that the external quantum efficiency is 18.1%, the driving voltage is 6.0 V, the lifetime is 330 hours, and the voltage increment is 0.12 V.

Table 1 below summarizes measurements results of Examples 1-3 and Comparative Examples 1-5.

TABLE 1

|  | External quantum efficiency (%) | Driving voltage (V) | Lifetime (h) | Voltage increment (V) |
| --- | --- | --- | --- | --- |
| Ex. 1 | 18.5 | 6.6 | 330 | 0.12 |
| Ex. 2 | 18.5 | 6.5 | 335 | 0.12 |
| Ex. 3 | 18.6 | 6.2 | 335 | 0.13 |
| Comp. Ex. 1 | 18.5 | 7.5 | 220 | 0.50 |
| Comp. Ex. 2 | 18.3 | 6.9 | 190 | 0.30 |
| Comp. Ex. 3 | 18.1 | 7.9 | 160 | 0.45 |
| Comp. Ex. 4 | 17.6 | 7.7 | 145 | 0.55 |
| Comp. Ex. 5 | 18.1 | 6.0 | 330 | 0.12 |

Referring to the Example 1 and the Comparative Example 1 in the table 1, it is understood that both lowering of the driving voltage and extension of a lifetime are accomplished by providing both the P-doped layer 3 and the PD-blocking layer 4. Referring to the Example 2 and the Comparative Example 1, it is also understood that both lowering of the driving voltage and extension of a lifetime are accomplished when the PD-blocking layer 4 is formed to have a thickness of about 20 nm.

For example, when a display panel having matrix pixels formed using organic electroluminescence elements according to Example 3, a leak current between adjacent pixels is two times larger than that of Examples 1-2. An influence of the increased leak current on the display performance, however, may not be recognized.

Also, as can be seen from Comparative Example 5, while a PD-blocking layer having a thickness of about 50 nm may facilitate both lowering of a driving voltage and extension of a lifetime, a leak current between adjacent pixels is increases ten times, e.g., as compared to Example 1. It is understood from this result that a limit of the thickness of the PD-blocking layer 4 is about 20 nm in order to avoid current leakage.

Also, as can be seen from Example 1 and Example 3, it is understood that both lowering of the driving voltage and extension of the lifetime is not dependent upon existence of the hole injection layer exists. Further, an effect of reducing the driving voltage is improved in proportion to an increase in thickness of the P-doped layer 3.

Also, as can be seen from a comparison between the Comparative Examples 1-2 and Example 1, when the PD-blocking layer 4 is eliminated and the P-doped layer 3 is thick, an effect of reducing a driving voltage may be partly obtained. However, the lifetime is shortened.

Further, as can be seen from a comparison between Comparative Examples 3-4 and Example 1, the above-described effects (i.e., lowering of a driving voltage and extension of a lifetime) are not obtained when a PD-blocking layer 4 is replaced with a different material. Also, replacement of the PD-blocking layer 4 with a hole transport material (e.g., TPD, TCTA, CuPC, etc.) does not extend the lifetime.

The above description is made using a bottom emission type organic electroluminescence formed by sequentially stacking components on a transparent substrate from an anode electrode 1. However, it is possible to implement an organic electroluminescence display device of the inventive concept using a top emission type organic electroluminescence formed by sequentially stacking components on a transparent substrate from a cathode electrode 8.

According to example embodiments, an organic electroluminescence element of an organic electroluminescence display includes a P-doped layer with a P-type dopant and a PD-blocking layer to block diffusion of the P-type dopant from the P-doped layer to the light emitting layer. The PD-blocking layer may be a hexanitrile hexaazatriphenylene (HAT) layer having a thickness of about 1 nm to about 20 nm, and may be positioned directly between the P-doped layer and a hole transport layer. Such a structure may reduce the driving voltage of the organic electroluminescence element by prevent diffusion of the P-type dopant. Thus, stability of the driving voltage over time may be implemented and the driving lifetime may be extended.

In general, since thickness of the organic medium between the anode electrode and the cathode electrode is limited according to a spectrum peak of each original color of RGB, it may be difficult to form the organic medium to have a thin thickness exceeding the limit. Further, since a driving voltage of the organic electroluminescence element increases in proportion to an increase in the thickness of the organic thin film, a driving power of an associated organic electroluminescence element is also based on the spectrum peak value of the original color to be emitted.

Attempts have been made to form a p-type doping layer at a part of the electron transport layer to reduce the driving voltage. However, as the p-type dopant may diffuse into the light emitting layer, stability of the driving voltage may not be properly maintained and a driving lifetime of the light emitting layer may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence display device, comprising:
 a p-doped layer doped with a P-type dopant on an anode electrode;
 a P-type dopant diffusion blocking layer on the p-doped layer;
 a first hole transport layer on the P-type dopant diffusion blocking layer;
 a light emitting layer on the first hole transport layer;
 an electron transport layer on light emitting layer; and
 a cathode electrode on the electron transport layer, the p-doped layer, the P-type dopant diffusion blocking layer, the first hole transport layer, and the light emitting layer being stacked in the stated order on the anode.

2. The organic electroluminescence display device as claimed in claim 1, wherein the P-type dopant diffusion blocking layer is a hexanitrile hexaazatriphenylene (HAT) layer.

3. The organic electroluminescence display device as claimed in claim 2, wherein the P-type dopant diffusion blocking layer has a thickness of about 1 nm to about 20 nm.

4. The organic electroluminescence display device as claimed in claim 1, wherein the P-type dopant diffusion blocking layer has a thickness of about 1 nm to about 20 nm.

5. The organic electroluminescence display device as claimed in claim 1, further comprising a hole injection layer between the anode electrode and the p-doped layer.

6. The organic electroluminescence display device as claimed in claim 1, wherein the P-type dopant diffusion blocking layer is separate from and includes a different material than the p-doped layer.

7. The organic electroluminescence display device as claimed in claim 6, wherein the p-doped layer is a second hole transport layer including NPB (N,N-di(naphthalene-1-yl)-N, N-diphenyl-benzidene).

8. The organic electroluminescence display device as claimed in claim 7, wherein the P-type dopant in the p-doped layer is tetrafluoro-tetracyanoquinodimethane ($F_4$-TCNQ).

9. The organic electroluminescence display device as claimed in claim 7, wherein the first and second hole transport layers are completely separated from each other by the P-type dopant diffusion blocking layer.

10. The organic electroluminescence display device as claimed in claim 6, wherein the P-type dopant diffusion blocking layer is separate from and includes a different material than the second hole transport layer.

* * * * *